(12) United States Patent
Den et al.

(10) Patent No.: US 6,737,668 B2
(45) Date of Patent: May 18, 2004

(54) METHOD OF MANUFACTURING STRUCTURE WITH PORES AND STRUCTURE WITH PORES

(75) Inventors: Tohru Den, Tokyo (JP); Tatsuya Iwasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 298 days.

(21) Appl. No.: 09/895,464

(22) Filed: Jul. 2, 2001

(65) Prior Publication Data
US 2002/0014621 A1 Feb. 7, 2002

(30) Foreign Application Priority Data
Jul. 3, 2000 (JP) ........................................ 2000-201366

(51) Int. Cl.[7] .............................................. H01L 29/06
(52) U.S. Cl. ............................................................ 257/9
(58) Field of Search .............................. 287/9, 10, 11, 287/12, 13, 14, 15, 16, 17, 18, 19, 20, 21, 22, 23, 24, 25, 26, 27; 436/400, 408, 409, 439, 441, 466

(56) References Cited

U.S. PATENT DOCUMENTS

| 6,139,713 A | 10/2000 | Masuda et al. | ............. 205/206 |
| 6,214,738 B1 | 4/2001 | Aiba et al. | .................. 438/707 |

FOREIGN PATENT DOCUMENTS

| EP | 0913508 A2 | 5/1999 |
| EP | 0951047 A2 | 10/1999 |
| JP | 10-121292 | 5/1998 |
| JP | 11-139815 | 5/1999 |
| JP | 11-194134 | 7/1999 |
| JP | 11-200090 | 7/1999 |
| JP | 11-224422 | 8/1999 |
| JP | 2000-31462 | 1/2000 |
| JP | 2001-83536 A | * 3/2001 |

OTHER PUBLICATIONS

Hideki Masuda et al., "Fabrication of a One–Dimensional Microhole Array by Anodic Oxidation of Aluminum," 63(23) *Appl. Phys. Lett.* 3155–3157 (1993).
H. Masuda, 31(5) *Solid State Physics* 493–499 (1996).
R.C. Furneaux et al., "The Formation of Controlled–Porosity Membranes From Anodocally Oxidized Aluminum," 337 *Nature* 147–149 (1989).
Hideki Masuda et al., "Fabrication of Gold Nanodot Array Using Anodic Porous Alumina as an Evaporation Mask," 35(2) *Jpn. J. Appl. Phys.* 35(2) L126–L129 (1996).

* cited by examiner

*Primary Examiner*—Nathan J. Flynn
*Assistant Examiner*—Kevin Quinto
(74) *Attorney, Agent, or Firm*—Fitzpatrick, Cella, Harper & Scinto

(57) ABSTRACT

A method of manufacturing a structure with pores which are formed by anodic oxidation and whose layout, pitch, position, direction, shape and the like can be controlled. The method includes the steps of: disposing a lamination film on a substrate, the lamination film being made of insulating layers and a layer to be anodically oxidized and containing aluminum as a main composition; and performing anodic oxidation starting from an end surface of the lamination film to form a plurality of pores having an axis substantially parallel to a surface of the substrate, wherein the layer to be anodically oxidized is sandwiched between the insulating layers, and a projected pattern substantially parallel to the axis of the pore is formed on at least one of the insulating layers at positions between the pores.

16 Claims, 11 Drawing Sheets

METHOD OF MANUFACTURING STRUCTURE WITH PORES AND STRUCTURE WITH PORES

BACKGROUND OF THE INVENTION

1. Field of the Invention

The present invention relates to a method of manufacturing a structure with pores and a structure with pores, and more particularly the structure with pores manufactured by the method of the present invention is usable in a wide range, such as electronic devices, magnetic devices, quantum effect devices as well as optical devices, micro devices, and three-dimensional structures.

2. Related Background Art

<Nano Structure>

A thin film, a fine wire, or a dot made of metal or semiconductor having a size smaller than some characteristic length exhibits sometimes significant electrical, optical or chemical performance because a motion of electrons is confined. From this viewpoint, strong attention has been paid to material having a fine structure (nano structure) smaller than several hundreds nanometer (nm), as functional material.

An example of a method of manufacturing a nano structure is semiconductor processing technology such as fine pattern drawing technology including photolithography, electron beam exposure, and x-ray exposure.

In addition to such technology, there is a new approach to realizing a novel nano structure by using as a base a naturally formed regular structure, i.e., self-ordered structure. This approach has been studied in many fields because it is expected that a structure finer and more specific than a conventional method may be manufactured depending upon the kind of a fine structure used as the base.

An example of such a self-ordering approach is anodic oxidation which can manufacture a nano structure having pores of nano size, easily and with good controllability. For example, anodically oxidized alumina is known which is manufactured by anodically oxidizing aluminum and its alloy in acid solution.

<Anodically Oxidized Alumina>

A porous oxide coating film can be formed by anodically oxidizing an Al plate in acid electrolytic solution (for example, refer to "Nature", Vol. 337, p.147 (1989) by R. C. Furneaux, W. R. Rigby & A. P. Davidson). The feature of this porous oxide coating film resides in the specific geometric structure that as shown in FIGS. 11A and 11B, ultra fine cylindrical pores (nano holes) 11 having a diameter of several nm to several hundreds nm are disposed in parallel at a pitch (cell size) of several nm to several hundreds nm. These cylindrical pores 11 have a high aspect ratio and are excellent in uniformity of cross sectional diameters.

The nano structure can be controlled to some extent by the conditions of anodic oxidation. For example, it is known that the pore pitch, depth and diameter can be controlled to some extent by an anodic oxidation voltage, time and a pore wide process, respectively.

In order to improve verticality, linearity and independency of pores of an anodically oxidized oxide coating film, a two-step anodic oxidization method has been proposed (refer to "Japanese Journal of Applied Physics". Vol. 35, Part 2, No. 1B, pp. L126 to L129, Jan. 15, 1996). That is, in this two-step anodic oxidization method, after a porous oxide coating film formed thorough anodic oxidation is once removed, anodic oxidation is again performed to form a porous oxide coating film having pores with improved verticality, linearity and independency. This method utilizes the fact that recesses on the surface of an Al plate, which are formed when the anodically oxidized coating film formed by the first anodic oxidation is removed, become starting points of forming pores by the second anodic oxidation.

In order to improve the controllability of shapes, pitches and patterns of pores of a porous oxide coating film, a method of forming starting points of forming pores by using a stamper has also been proposed (refer to Japanese Patent Application Laid-Open No. 10-121292 by Nakao or "Solid Physics" by Masuda, 31, 493 (1996)). That is, in this method, recesses as pore forming start points are formed by pressing a substrate having a plurality of projections on its surface toward an Al plate, and thereafter anodic oxidation is performed to form a porous oxide coating film having pores with improved controllability of shapes, pitches and patterns. Techniques of forming pores not of a honeycomb shape but of a concentrical shape were reported by Ohkubo et al in Japanese Patent Application Laid-Open No. 11-224422.

Another report by Masuda intends to dispose pores in rows by anodically oxidizing an Al film in a film surface direction, the Al film being sandwiched between insulators (refer to "Appl. Phys. Lett." 63, p. 3155 (1993)).

By paying attention to the specific geometric structure of anodically oxidized alumina, various applications are tried. Although the details of these applications are given by in the explanation by Masuda, some applications will be enumerated below.

For example, there are an application to a coating film by utilizing anti-abrasion and insulation of an anodically oxidized film and an application to a filter made of a peeled-off coating film. Further, by using techniques of filling metal, semiconductor or the like in pores or techniques of forming replicas of pores, various applications are tried to those of coloring, magnetic recording media, EL light emitting elements, electrochronic elements, optical elements, solar batteries, gas sensors and the like. Applications to other fields are also expected, for example, quantum effect devices such as quantum wires and MIM elements, molecule sensors using pores as chemical reaction fields, and the like (refer to "Solid Physics" by Masuda, 31, 493 (1996)).

SUMMARY OF THE INVENTION

A nano structure manufacturing method using semiconductor processing technology (e.g., photolithography technology) is, however, associated with the problems of poor manufacture yield and high system cost. A method capable of manufacturing a nano structure with simple processes and with high reproductivity has been desired. Since photolithography basically utilizes a film forming process and an etching process, it is not suitable for a three-dimensional processing method such as forming a circular pore in parallel to the substrate. From this viewpoint, a self-ordering method, particularly, an anodic oxidation method, is preferable because it can manufacture a nano structure relatively easily and with good controllability and can manufacture a large area nano structure. However, there is a limit in the structure controllability so that applications effectively utilizing the significant structure are not realized as yet.

For example, nano holes (pores) in alumina are generally formed in the surface layer of an Al plate and the direction of each pore is perpendicular to the Al plate surface. Further, as described earlier, although the method of forming pores in parallel to the substrate surface was reported, the shapes of pores are likely to become irregular.

An object of the invention is to solve the above problems and provide a structure with pores with good controllability.

Specifically, an object of the present invention is to control the layout, pitch, position, direction, shape and the like of pores to be formed through anodic oxidation and provide a manufacture method of a nano structure, e.g., a nano structure having pores disposed along a specific direction of a substrate.

Another object of the present invention is to provide a manufacture method for a nano structure having a plurality of pore rows with a specific correlation (e.g. pores in upper and lower rows disposed at the same position or at zigzag positions along the column direction).

Further object of the present invention is to provide a method of filling fillers in pores formed by the above-described methods.

Still another object of the present invention is to provide a novel structure with pores formed by the above-described methods The above objects can be achieved by the invention as in the following.

According to one aspect of the present invention, there is provided a method of manufacturing a structure with pores (holes) which comprises the steps of: disposing a lamination film on a substrate, the lamination film comprising insulating layers and a layer to be anodically oxidized and containing aluminum as a main composition; and performing anodic oxidation starting from an end surface of the lamination film to form a plurality of pores (holes) having an axis substantially parallel to a surface of the substrate, wherein the layer to be anodically oxidized is sandwiched between the insulating layers, and a projected pattern substantially parallel to the axis of the pores (holes) is formed on at least one of the insulating layers at positions between the pores (holes).

The layer to be anodically oxidized is preferably made of aluminum. It is effective in some cases that at least one of the insulating layers is formed by anodic oxidation.

In order to improve regularity, a height of the projected pattern of the insulating layer is preferably 1/10 or more of a thickness of the layer to be anodically oxidized The method may further comprises a step of filling a filler in each of the pores after the step of performing anodic oxidation. The step of filling a filler is preferably performed by plating.

The structure with pores manufactured by the above-described manufacture method provides novel nano structure devices. If an electrode is to be formed to a filler in each pore, it is preferable to form an electrode layer connected to a bottom of each of the pores.

According to another aspect of the present invention, there is provided a method of manufacturing a structure with pores (holes) which comprises the steps of: sandwiching a film containing aluminum as a main composition between first and second insulating films; and anodically oxidizing the film having aluminum as the main composition along a direction substantially perpendicular to a direction of making the first and second insulating films face each other, wherein projections are formed on a surface of at least one of the first and second insulating films in contact with the film containing aluminum as the main composition, the projections controlling a pitch between the pores (holes) to be formed by anodic oxidation.

Next, in order to facilitate to understand the operation of the invention, prior arts will be described with reference to FIGS. 10A and 10B and FIGS. 11A and 11B.

FIGS. 10A and 10B show lateral anodic oxidation pores according to a prior art, and FIGS. 11A and 11B show vertical anodic oxidation pores according to another prior art. In these Figures, reference numeral 11 represents a pore (nano hole), reference numeral 12 represents an anodically oxidized oxide layer containing alumina at its main composition, reference numeral 14 represents a substrate, reference numeral 15 represents a lower insulating layer, reference numeral 16 represents an upper insulating layer, reference numeral 53 represents a barrier layer, and reference numeral 101 represents an Al plate.

Most usual vertical pores of the prior art are shown in FIGS. 11A and 11B. FIG. 11A is a diagram as viewed from the anodically oxidized layer surface side, and FIG. 11B is a cross sectional view taken along line 11B—11B shown in FIG. 11A. By using the Al plate as an anode, as anodic oxidation is performed in specific acid solution, the surface of the Al plate starts being oxidized. In this case, the Al substrate is oxidized and at the same time specific regions are etched so that pores 11 start being formed in the anodically oxidized layer 12. These pores are formed generally in a direction perpendicular to the Al plate surface. An insulating barrier layer 53 is also formed between the bottom of each pore and the Al plate 101. With this method, there is a distribution of pitches of pores and the position of each pore cannot be controlled. When pores are formed deeply, growth of some pores is stopped in the midst of the forming process or pores are branched with a branching phenomenon. There is therefore a tendency of disordering of pores.

Lateral anodic oxidation pores are shown in FIGS. 10A and 10B. FIG. 10A is a cross sectional view of the anodically oxidized layer cut in parallel to the layer surface near at the central portion thereof, i.e., a cross sectional view taken along 10A—10A shown in FIG. 10B. FIG. 10B is a cross sectional view taken along line 10B—10B shown in FIG. 10A. As shown, a layer made of an Al thin film to be anodically oxidized is sandwiched between insulating layers and anodic oxidation is performed from one side. Specifically, a lower insulating layer 15, Al layer and upper insulating layer 16 are formed in this order on the substrate 14, and anodic oxidation is performed from one side of this lamination film to form lateral pores. As illustrate in FIG. 10B, similar to the vertical pores, lateral pores are also likely to be disturbed. Intermediate growth stop and branching of pores are therefore likely to occur. As shown, a barrier layer 53 exists between the layer 61 still not anodically oxidized and the pores. The interface of this barrier layer is also disturbed being influenced by the disturbance of pores.

The present inventors have vigorously studied in order to eliminate this disturbance it has been found that by forming projections and recesses on at least one of the upper and lower insulating layers, not only this disturbance is eliminated but also regularity of pores can be controlled not only along the lateral direction but also along the vertical direction if lateral pores are stacked.

This operation may be considered as in the following. There is a tendency that pores having pitches depending upon the conditions of anodic oxidation are formed. This can be ascribed to that the thickness of an insulating film formed between pores depends on the conditions of anodic oxidation. If projections and recesses having a pitch approximately the same as that between pores matching the anodic oxidation conditions are formed on the insulating layer along the pore forming direction, it can be considered that pores are likely to be formed in correspondence with the projections and recesses. Namely, at the position corresponding to the projection of the insulating layer, an insulating layer matching the anodic oxidation conditions is not formed so that pores are likely to be formed at positions of recesses. With this method, a nano structure having pores disposed regularly along a specific direction can be formed.

The term "regularly" used in this specification intends to mean a structure having pore columns having substantially the same pore pitch and diameter, without the disturbed state of pore columns at least in the pore layer such as shown in FIGS. 10A and 10B. The regular structure means a structure having the above-described correlation between positions of pores in respective pore layers and a structure having pores regularly filled with fillers.

DETAILED DESCRIPTION OF THE PREFERRED EMBODIMENTS

<Constitution of Lamination Film>

A film constitution of the invention will be described first.

The constitution of a nano structure of the invention includes:

(1) Single layer constitution: A single anodically oxidized layer (layer containing aluminum as its main composition) having pores is sandwiched between first and second patterned insulating films.

(2) Lamination layer constitution: Two anodically oxidized layers (layers containing aluminum as its main composition) having pores are each sandwiched between first and second patterned insulating films.

Example of the constitution of a nano structure of the invention will be described with reference to FIGS. 1A, 1B and 1C to FIGS. 5A and 5B and with reference to FIGS. 10A and 10B and FIGS. 11A and 11B of prior arts.

Figure 1A:
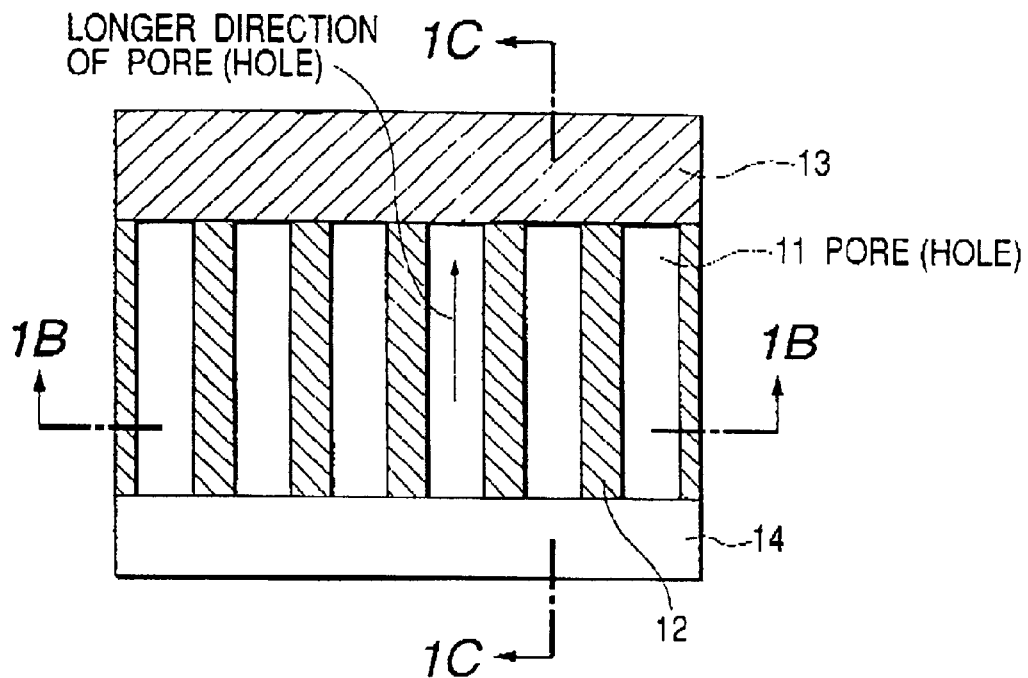
FIGS. 1A, 1B and 1C are schematic views showing a structure according to the invention.
Figure 1B:
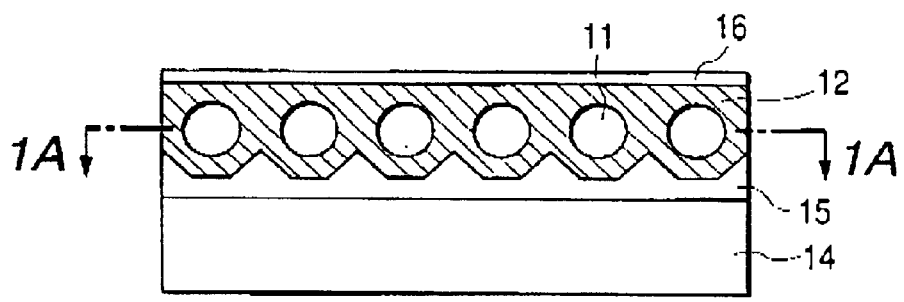
Figure 1C:
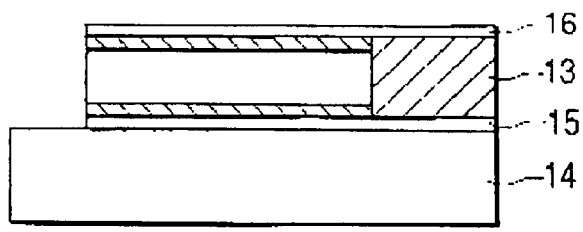

FIGS. 1A to 1C are schematic diagrams showing a structure having pores (holes) according to the invention. FIG. 1A is a cross sectional view taken along line 1A—1A in parallel to the surface, FIG. 1B is a cross sectional view taken along line 1B—1B vertically to the surface, FIG. 1C is a cross sectional view taken along line 1C—1C vertically to the surface.

Figure 2A:
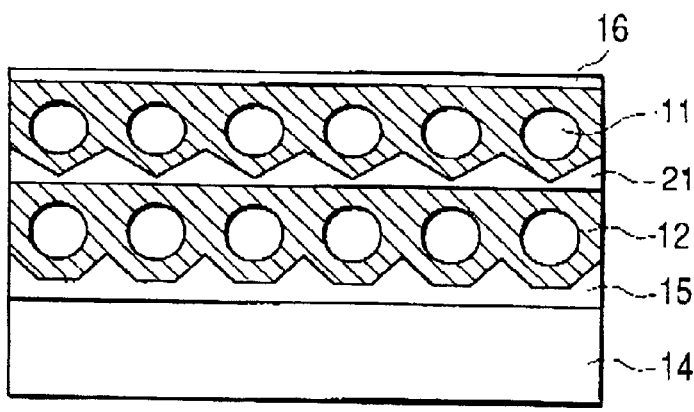
FIGS. 2A, 2B, 2C and 2D are cross sectional views showing structures (lamination structures) according to the invention.
Figure 2B:
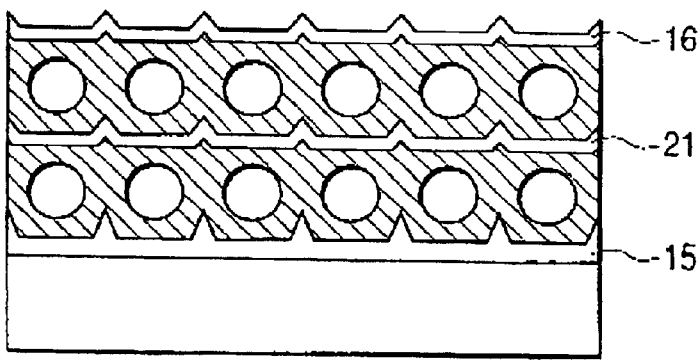
Figure 2C:
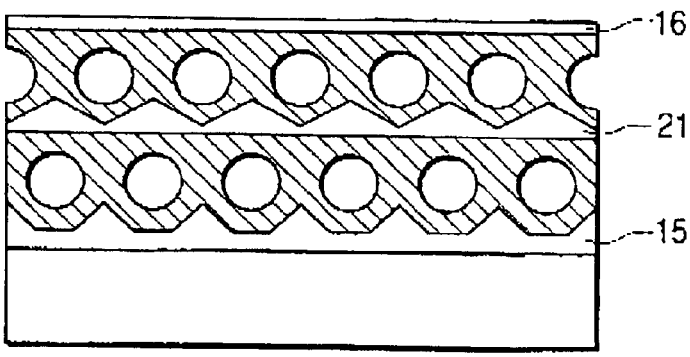
Figure 2D:
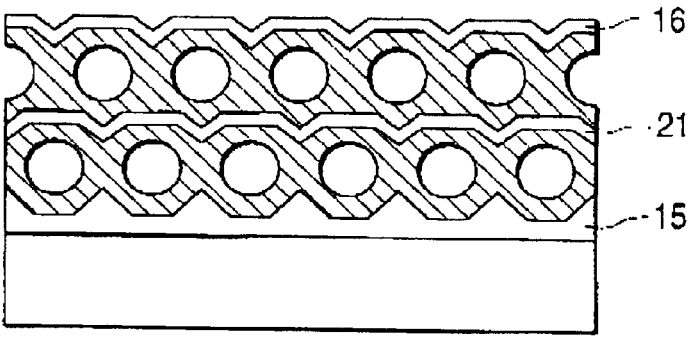

FIGS. 2A to 2D are cross sectional views showing structures (lamination structure) having pores (holes) according to the invention. FIGS. 2A and 2B show a lamination structure having the same positions of upper and lower pores (holes), and FIGS. 2C and 2D show a lamination structure having shifted positions of upper and lower pores (holes).

Figure 3A:
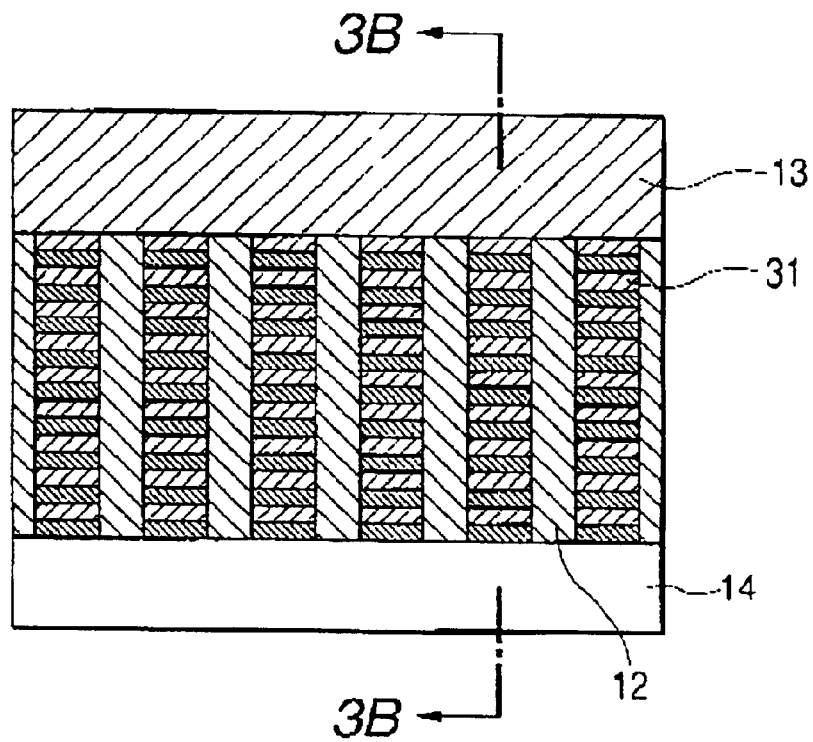
FIGS. 3A and 3B are schematic views showing a structure with fillers according to the invention.
Figure 3B:
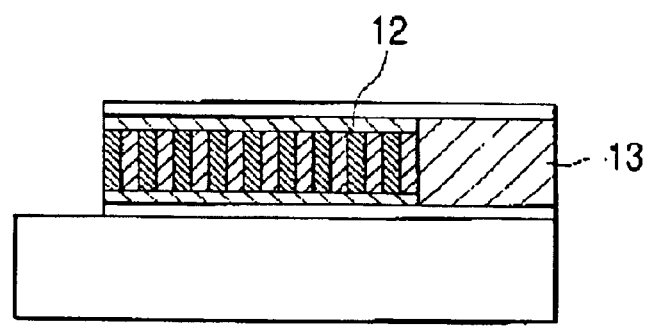

FIGS. 3A and 3B are schematic diagrams showing a structure having pores (holes) filled with fillers according to the invention, FIG. 3A is a cross sectional view cut in parallel to the surface thereof, and FIG. 3B is a cross sectional view taken along line 3B—3B vertically to the surface.

Figure 4A:
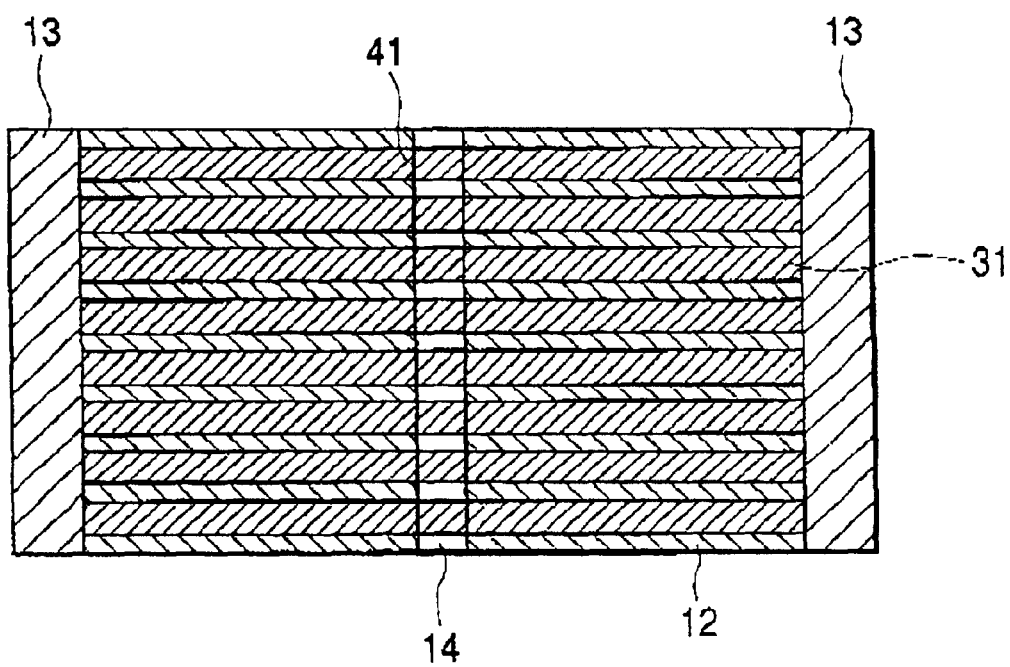
FIGS. 4A and 4B are cross sectional views showing structures (with fillers) according to the invention.
Figure 4B:
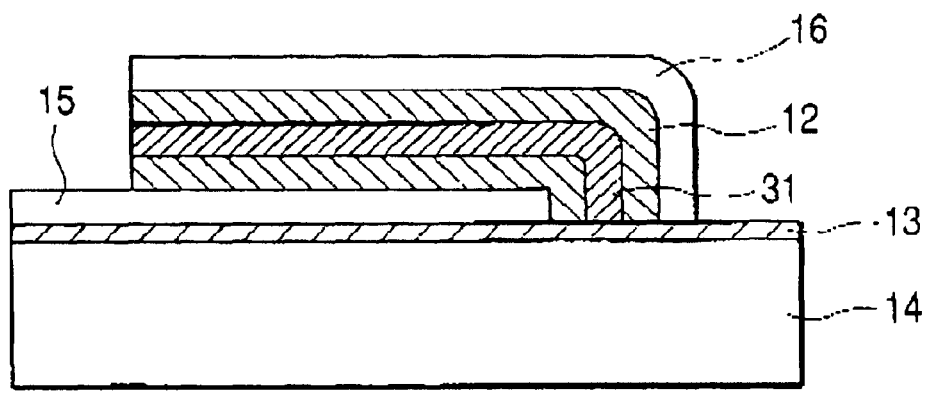

FIGS. 4A and 4B are cross sectional views of structures having pores (holes) (with fillers) according to the invention, FIG. 4A is a cross sectional view showing the structure with fillers in right and left pores (holes) being connected, and FIG. 4B is a cross sectional view with pores (holes) intermediately bent.

Figure 5A:
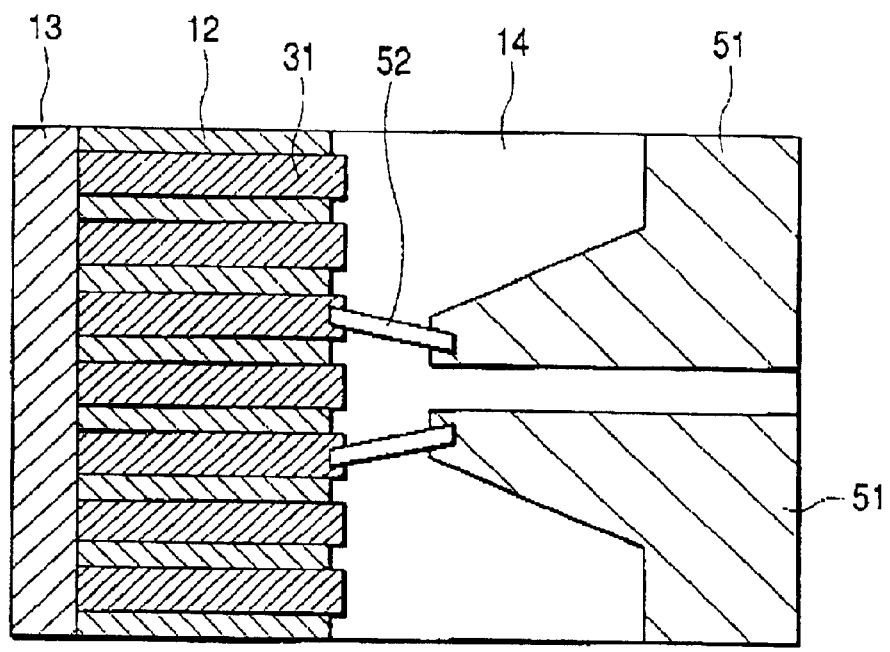
FIGS. 5A and 5B are cross sectional views showing a structure (with fillers) according to the invention.
Figure 5B:
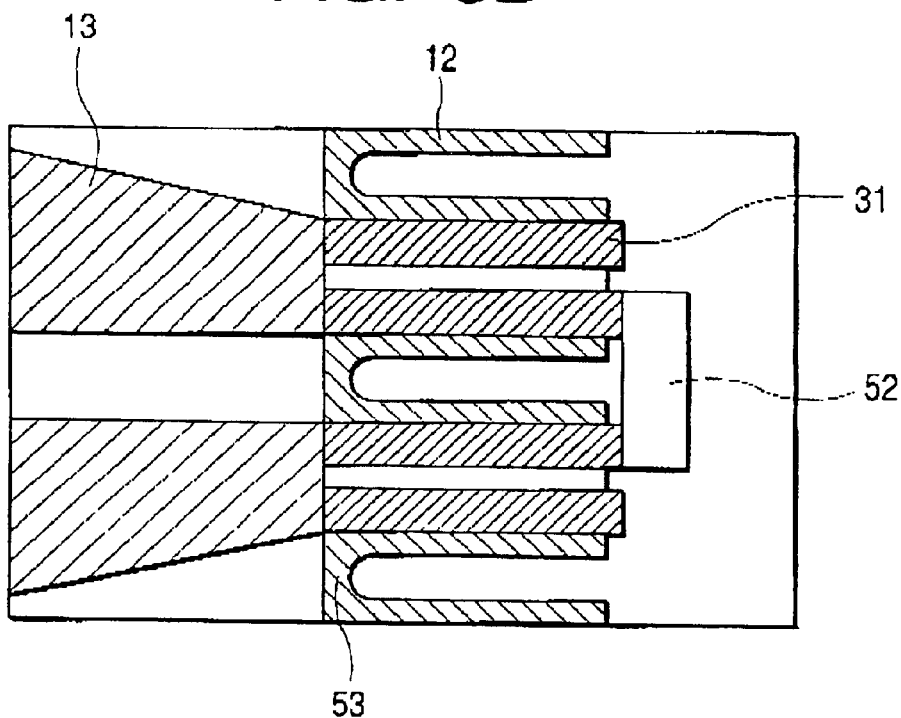

FIGS. 5A and 5B are cross sectional views showing structures having pores (holes) (with fillers) in which electrodes are connected to the fillers in pores (holes).

Figure 10A:
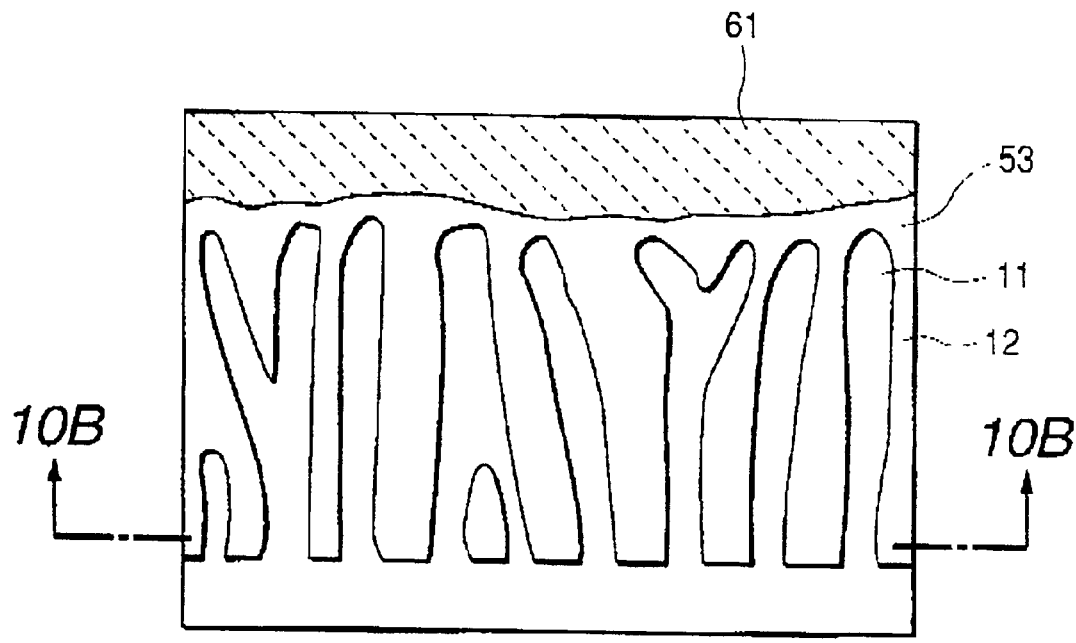
FIGS. 10A and 10B are schematic views showing lateral anodically oxidized alumina according to a prior art.
Figure 10B:
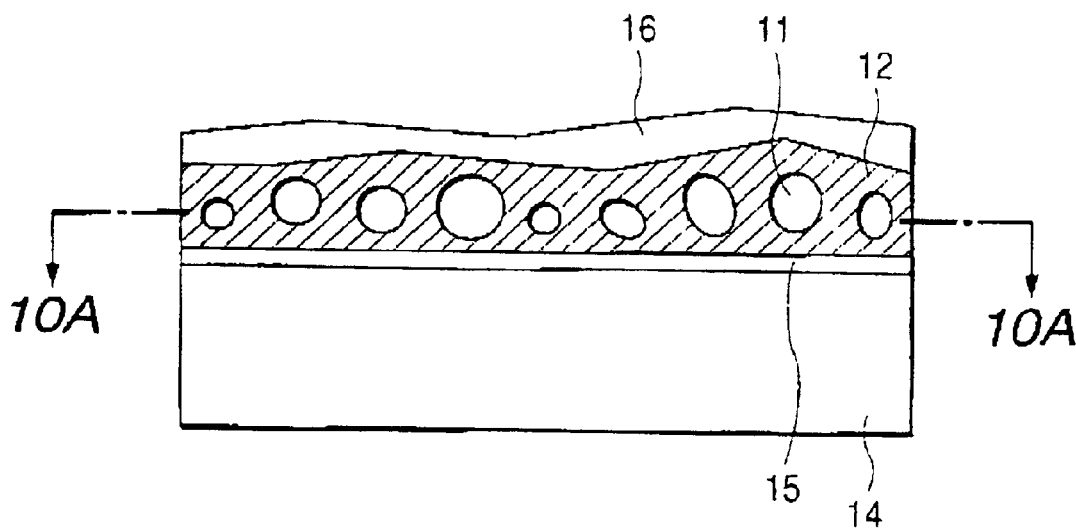
Figure 11A:
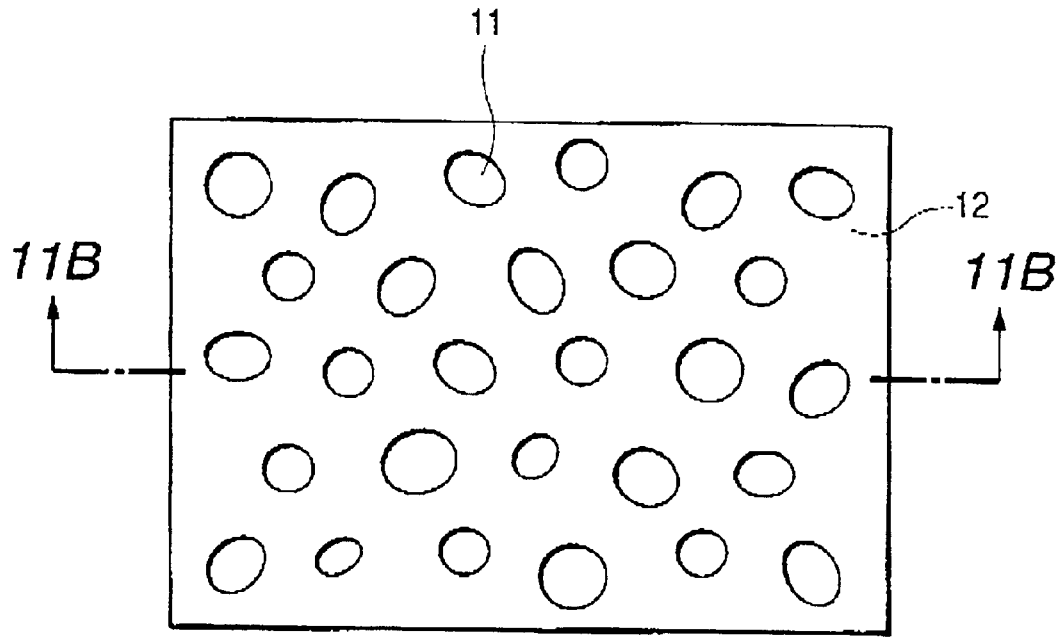
FIGS. 11A and 11B are schematic views showing vertical anodically oxidized alumina according to a prior art.
Figure 11B:
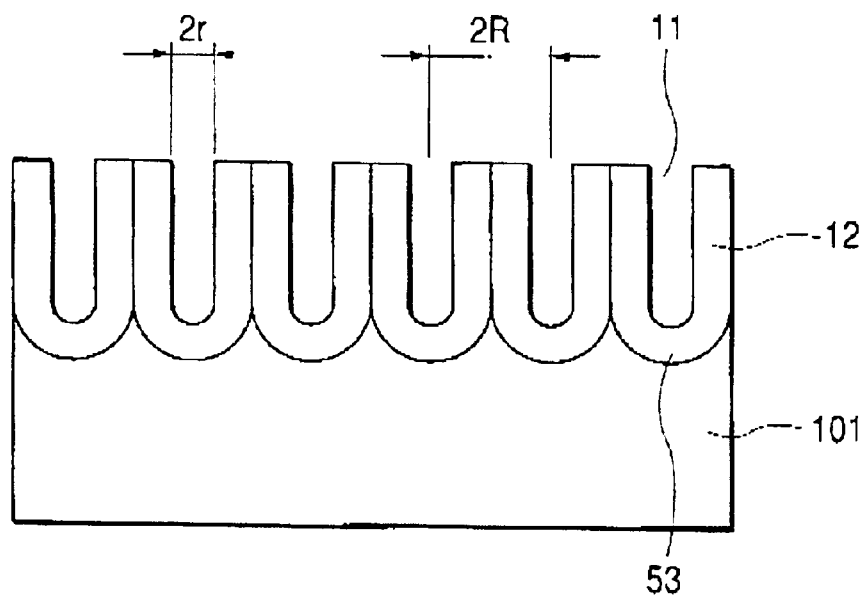

Specifically, FIGS. 1A to 1C show an example of the single layer constitution which is the fundamental constitution, FIGS. 2A to 2D show examples of the lamination constitution, FIGS. 3A and 3B show a specific constitution, FIG. 4A shows an example of the constitution made of a single layer with opposing pores (holes), FIG. 4B shows an example of the constitution whose pores (holes) are intermediately bent, FIGS. 5A and 5B show examples of the constitution having a single layer and fine electrodes connected to fillers. FIGS. 10A and 10B show an example of a lateral type according to a prior art, and FIGS. 11A and 11B show an example of a vertical type according to a prior art. In FIGS. 1A to 1C, FIGS. 2A to 2D, FIGS. 3A and 3B, FIGS. 4A and 4B, and FIGS. 5A and 5B, reference numeral 11 represents a pore (nano hole), reference numeral 12 represents an anodically oxidized layer containing alumina as its main composition, reference numeral 13 represents an electrode layer, reference numeral 14 represents a substrate, reference numeral 15 represents a lower insulating layer, reference numeral 16 represents an upper insulating layer, reference numeral 21 represents an intermediate insulating layer, reference numeral 31 represent a filler, reference numeral 41 represents a junction portion, reference numeral 51 represents an electrode, reference numeral 52 represents a junction portion, reference numeral 53 represents a barrier layer, and reference numeral 101 represents an Al plate.

The details of this invention will be given in the following.

(1) Single Layer Constitution

An example of the simplest constitution may be that shown in FIGS. 1A to 1C.

In the constitution shown in FIGS. 1A to 1C, an anodically oxidized layer 12 with pores (holes) 11 is formed over a substrate 14 and sandwiched between a patterned insulating layer (first insulating film) 15 and an upper insulating layer (second insulating film) 16.

<Insulating Layer>

A patterned insulating layer may be disposed either as an upper or lower layer. However, in terms of processes, it is more simple to form projections and recesses (projected pattern) on the lower insulating layer. In FIGS. 1A to 1C, although the lower insulating film is formed on the substrate, if the substrate is made of insulating material and can be formed with projections or recesses, this substrate may be used as the lower insulating layer.

The insulating layer may be any layer so long as it is made of insulating material. It is preferable that the material is hard to be corroded by acid during anodic oxidation. The material is preferably capable of being formed with a fine pattern, although it depends on a patterning process. Specifically, the material may be oxide such as $SiO_2$ and $Al_2O_3$, nitride such as SiN and AlN, as well as glass, synthetic resin, resist or the like. As a method of forming such an insulating layer, vacuum film forming such as PVD and CVD, spin coating, surface oxidizing of metal or semiconductor, or the like may be used although it depends on the kind of the insulating layer to be formed. The insulating layer, particularly the upper insulating layer and an intermediate insulating layer used for stacked pores shown in FIGS. 2A to 2D, may be formed by oxidizing the surface of a layer to be anodically oxidized. This oxidation may be performed by plasma oxidation, thermal oxidation as well as anodic oxidation under the conditions of not forming pores.

A thickness of the insulating layer is not specifically limited. However, in practice, the thickness is preferably in a range from several nm to several μm from the reason of the process restrictions. A height of the projected pattern is preferably about a pore diameter or tenth part (1/10) or more of the thickness of the layer to be anodically oxidized.

<Layer to be Anodically Oxidized>

The layer to be anodically oxidized is preferably a film containing Al as its main composition, or obviously a film containing pure Al. This layer is formed generally by resistance heating evaporation, sputtering or the like, although it depends upon the compositions of the layer. It is obvious that the vacuum film forming method such as PVD and CVD may also be used if an Al film having a desired uniformity can be formed. As an Al layer is formed, if projections and recesses (projected pattern) are formed on the lower insulating films, the projections and recesses are reflected upon the lower surface of the Al layer. Whether the projections and recesses are also to be reflected upon the upper surface of the Al layer can be controlled by the film forming conditions.

A thickness of the layer to be anodically oxidized is not specifically limited. However, the thickness is preferably about a half to several times of the pore diameter.

<Electrode>

The electrode at the bottoms of pores will be described. In the conventional example shown in FIGS. 10A and 10B, only the layer still not anodically oxidized exists under the bottoms of pores with the barrier being interposed therebetween. It is preferable to form an electrode layer if electrical connection and the like are desired to be formed in pores, or to form an electrode layer as a growth stopper layer for pores. As shown in FIGS. 1A to 1C, the electrode layer may be formed to the same height as that of the layer to be anodically oxidized. The material of the electrode layer may be valve metal such as Ti, Nb, W, Zr and Hf, metal such as Pt and Cu, alloy thereof, or semiconductor such as Si. In order to maintain uniformity of pores, it is preferable that the interface between the electrode layer and the layer to be anodically oxidized has small projections and recesses.

(2) Lamination Constitution

Next, a multi-layered anodically oxidized layer such as shown in FIGS. 2A to 2D will be described. In the multi-layered anodically oxidized layer, there are mainly two cases, one that the positions of pores in upper and lower anodically oxidized layers are coincident as shown in FIGS. 2A and 2B and the other that the positions are shifted by just a half period as shown in FIGS. 2C and 2D. Other layouts are also possible. The lamination film is manufactured fundamentally in the same manner as that of the single layer constitution, excepting the intermediate insulating layer 21 is formed. The intermediate insulating layer forming method is classified mainly into two types, one that the surface of the layer to be anodically oxidized under the intermediate layer is flat and the other that projections and recesses are reflected.

When the surface of the first layer to be anodically oxidized is flat as shown in FIGS. 2A and 2C, the manufacture method same as for the single layer constitution is used. Namely, after the intermediate insulating layer is formed, it becomes necessary to form a projection/recess pattern (projected pattern).

When underlying projections and recesses are reflected upon the surface of the layer to be anodically oxidized such as shown in FIG. 2B, the intermediate insulating layer is formed to reflect the projections and recesses. In this case, the positions of upper and lower pores are coincident. If projections and recesses are formed on the anodically oxidized layer by etching or the like, the intermediate insulating layer formed reflects the projections and recesses (FIG. 2D).

For the multi-stage constitution, anodic oxidation may be performed after the lamination film is formed, or each layer may be stacked after each layer is anodically oxidized. The latter method is required in order to reflect the projections and recesses of the anodically oxidized layer, particularly the anodically oxidized layer such as shown in FIG. 2D.

<Forming Projection/Recession Pattern (Projected Pattern)>

In forming a projection/recess pattern (projected pattern), any method may be used if proper columns of projections and recesses can be formed. Such methods may be photolithography using a mask such as in semiconductor processes, interference exposer not using mask, electron beam drawing, method using a probe such as SPM, focussed ion beam (FIB) method, and stamp method.

The interference exposure method capable of forming a fine projection/recess layout in a broad area irrespective of a relatively simple method and the FIB method capable of forming a fine pore with relatively easy position adjustment, will be described in detail.

(Interference Lithography Method)

A method of forming a pattern of projections and recesses (projected pattern) is described below.

After a laser beam having high coherence is split by a half mirror into two beams, the two beams are again crossed on the substrate to form interference fringes on the substrate, the fringes being dependent upon the laser wavelength and cross angle. Photolithography is performed by using interference fringes to form projections and recesses (projected pattern) of resist. A laser light source to be used for interference exposure may be any laser light source such as excimer laser, He—Cd laser and Ar laser. However, since a fringe pitch smaller than a half of the wavelength is not formed, it is necessary to use a laser beam having a wavelength suitable for a pitch of the projection/recess pattern to be formed. It is preferable to obtain a stable output and utilize a laser quality called a TEMOO mode.

As a more specific manufacture method, a method of forming a projection/recess pattern (projected pattern) of positive resist will be described.

Resist is coated on a substrate having a sufficiently thick insulating layer. Before this coating, the surface of the substrate with the insulating layer is washed with acetone, IPA and the like and sufficiently dried.

Resist usable is both high resolution positive resist and high resolution negative resist. For example, such resist is AZ5214E positive resist manufactured by Clariant Japan K.K.

Before resist coating, in order to chemically improve wettability of resist relative to the underlying surface, it is effective to coat a surface coating layer. It is effective to coat an antireflection layer if the reflectivity of the subject to be processed is high or in order to suppress intra-film interference and reduce exposure variation. If the antireflection film is used as the underlying layer of resist, in order to expose the surface of the subject to be processed after resist exposure and development, dry etching is required.

Next, interference exposure is performed to expose the resist in stripe shapes, and thereafter, development is performed in developing solution so that a regular stripe projection/recess pattern extending to the surface of the insulating film can be formed.

These projections and recesses of resist themselves may be used directly as the projections and recesses of the insulating layer. However, in order to make the projections and recesses more stable, it is preferable to transform the projections and recesses of resist into projections and recesses of the insulating layer. To this end, it is necessary to perform reactive ion etching, ion beam etching, etching using etchant or the like.

(FIB Method)

The FIB method is more straightforward than the interference exposure method. Namely, after the insulating layer is formed, the substrate is placed in an FIB system. After the position alignment is performed by using a monitor device built in the FIB system, an FIB process is performed.

This position alignment can be performed at high precision with ease by using the monitor device built in a focussed ion beam processing system. This monitor function provides first a method of obtaining a scan image by detecting secondary electrons generated when the focussed ion beam is scanned on the workpiece. With this method, during the monitoring, the focussed ion beam is radiated. However, a scan image can be obtained even by using a sufficiently weak focussed ion beam. It is therefore possible to substantially eliminate the influence of radiation of a focussed ion beam used when the patterning position of a workpiece is set. If a focussed ion beam processing system with a monitor device such as a scanning electron microscope and a laser microscope is used, the patterning position of a workpiece can be set without radiation of a focussed ion beam.

For an FIB process, generally a beam obtained by accelerating and converging Ga ions is radiated to a desired position to perform sputtering. In this invention, an FIB is scanned in line at a desired position to form recesses in the insulating film.

A method of moving a focussed ion beam radiation position may be a method of moving a focussed ion beam, a method of moving a workpiece, a method combined the two methods or the like. The method of moving a focussed ion beam is rational in terms of system requirements. However, a movable distance is limited. Therefore, the method combined the two methods is considered to be suitable for forming pore in a broad area at a high density. A method of moving a workpiece is also applicable to this invention if a sample stage capable of controlling the position at a high precision is used.

<Anodic Oxidation Method>

Figure 9:
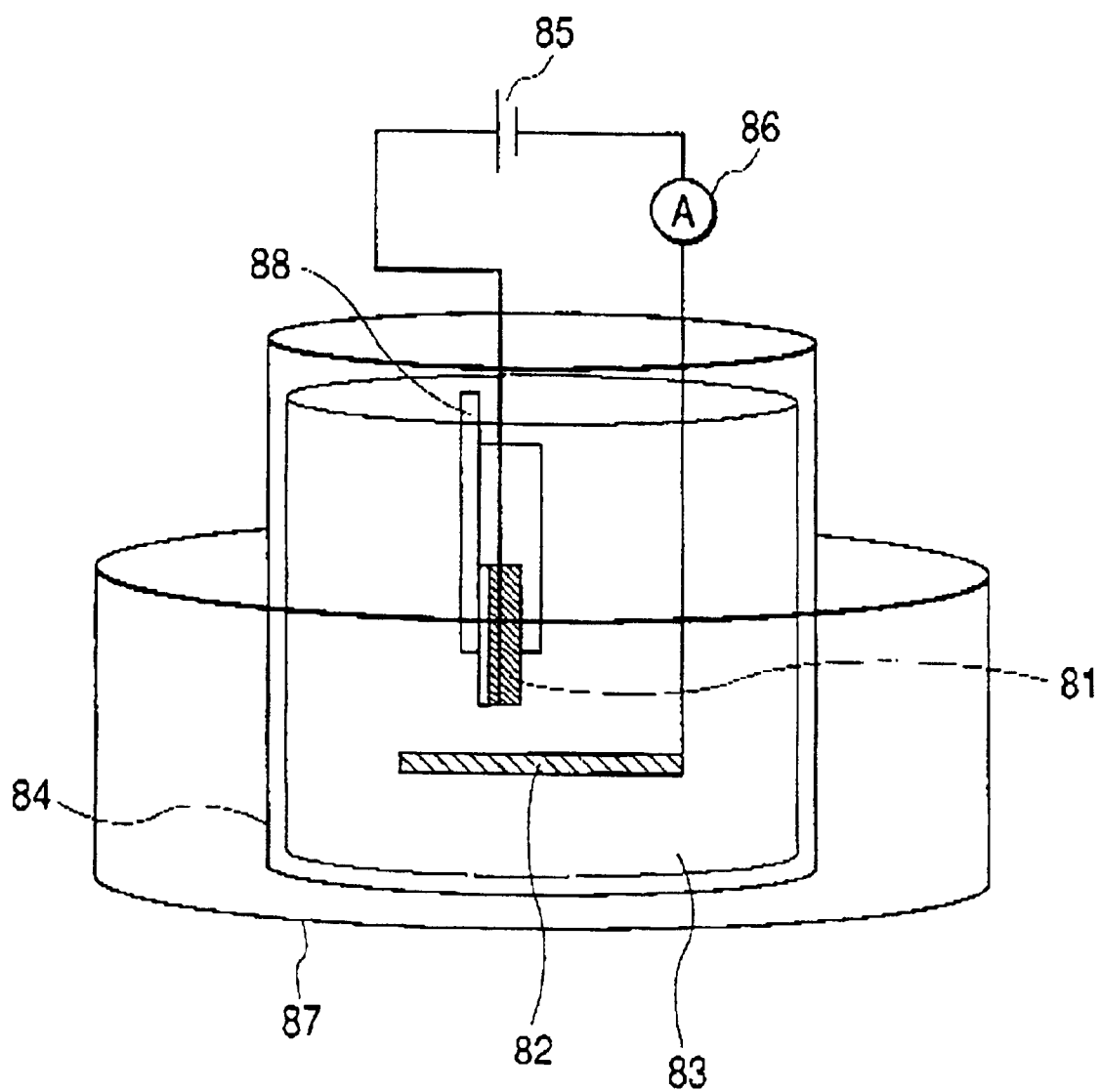
FIG. 9 is a schematic view showing an anodic oxidation system.

Anodic oxidation for a film containing aluminum as its main composition will be described with reference to FIG. 9 which is a schematic diagram showing an anodic oxidation system to be used for the anodic oxidation method. In FIG. 9, reference numeral 87 represents a constant temperature oven, reference numeral 81 represents a sample, reference numeral 88 represents a sample holder, reference numeral 83 represents electrolytic solution, reference numeral 84 represents a reaction chamber, reference numeral 82 represents a cathode of Pt, reference numeral 85 represents a power source for applying an anodic oxidation voltage, and reference numeral 86 represents an ammeter for measuring an anodic oxidation current. Although not shown in FIG. 9, a computer and the like for automatically controlling and measuring voltage and current are assembled.

The sample 81 and cathode 82 are immersed in electrolytic solution whose temperature is maintained constant by the constant temperature oven. Anodic oxidation is performed by applying a voltage from the power source to the cathode and sample.

Electrolytic solution used for anodic oxidation may be solution of oxalic acid, phosphoric acid, sulfuric acid, chromic acid or the like. The conditions of the anodic oxidation voltage, temperature and the like may be set properly depending upon the nano structure to be formed. Generally, it is usual that sulfuric acid solution is used for a low voltage of 30 V or lower, phosphoric acid solution is used for a high voltage of 80 V or higher, and oxalic acid solution is used for a voltage therebetween.

If the nano structure is immersed in acid solution such as phosphoric acid solution after the anodic oxidation, the diameter of pores can be broadened as desired. By controlling an acid concentration, a process time and a temperature, the nano structure having a desired pore diameter can be formed.

<Filling Fillers>

If a regular nano structure of the invention is to be applied to a device, a process of filling a filler in a pore becomes an important process. As a method of filling a filler in a pore, various methods can be used such as a method of dipping liquid material by utilizing the capillary phenomenon and a method of vapor depositing a filler in a pore along an axial direction. If material is to be deposited only in the pore, a method of using plating is preferable.

In order for plating of a filler in a pore, a proper voltage is applied between the opposing electrode and the electrode of a nano structure of the invention in plating solution. The nano structure of the invention shown in FIGS. 1A to 1C has the electrode layer 13 at the bottoms of pores. Therefore, electric plating starts from a portion near at the electrode layer and propagates into the pores. It is important to select the material of the opposing electrode in accordance with plating material and solution. Generally, the material of the opposing electrode is material same as that of plating material, material containing plating material, or metal or graphite having a low reaction.

In order to perform plating at a high precision, it is preferable to place a reference electrode in plating solution and control a voltage between the reference and opposing electrodes.

<Mounting Electrode>

If a regular nano structure of the invention is to be applied to a device, it is necessary in many cases to execute a process of mounting an electrode at the top end of a filler after the filler is filled in a pore. A method of mounting an electrode may be a method of mounting electrodes 51 to corresponding fillers as shown in FIG. 5A, a method of mounting divided electrodes 13 between corresponding fillers as shown in FIG. 5B, a method of mounting electrodes to opposite ends of fillers in juxtaposed pores as shown in FIG. 4A, and the like. It is obvious that other methods may also be used.

In connecting an electrode to a filler having a size of several tens nm, it is effective to use the FIB method capable of forming a fine metal wire of 100 nm or smaller. A fine metal wire can be formed by introducing deposit forming gas such as $W(CO)_6$ into the FIB processing system and radiating a focussed ion beam in line by controlling an ion beam diameter and an ion current to dissolve the deposit forming gas and attach gas composition to the substrate.

<Applications>

The invention allows anodic oxidation alumina to be applied in various fields such as quantum fine wires, MIM elements, molecule sensors, coloring, magnetic recording media, EL light emitting elements, electrochromic elements, optical elements such as photopic bands, electron emitting elements, solar batteries, gas sensors, anti-abrasion and insulating coating films, filters and the like. The application fields can be broadened considerably.

By filling functional materials such as metal, magnetic material and semiconductor in nano holes of a nano structure of this invention, this nano structure can be applied to new electronic devices, magnetic devices and optical devices.

Nano structures of this invention applied to electronic devices, magnetic devices and quantum devices are particularly effective because nano holes are disposed in parallel with the substrate surface and bonding of electrodes is easy.

<Embodiments>

The invention will be described in conjunction with some embodiments.

EXAMPLE 1

With reference to FIGS. 6A to 6D, FIGS. 7E to 7G and FIG. 9, Example 1 will be described in which regular pores (holes) are formed over a substrate by using an interference exposure method.

Figure 6A:
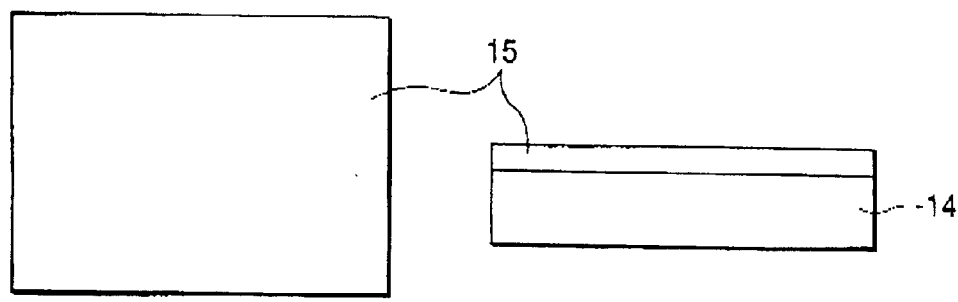
FIGS. 6A, 6B, 6C and 6D are schematic cross sectional views illustrating an example of the first half of manufacture processes for a structure according to the invention.
Figure 6B:
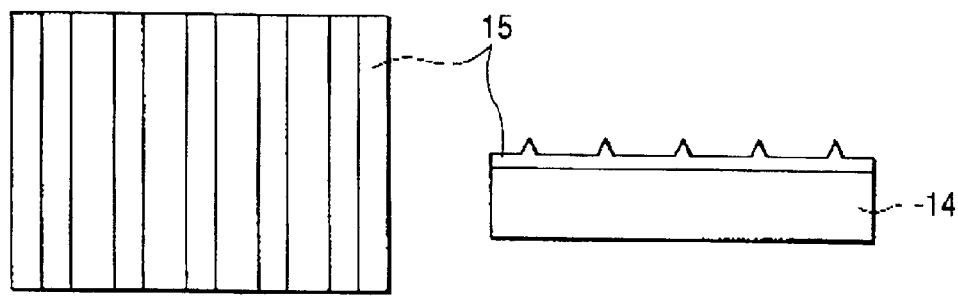
Figure 6C:
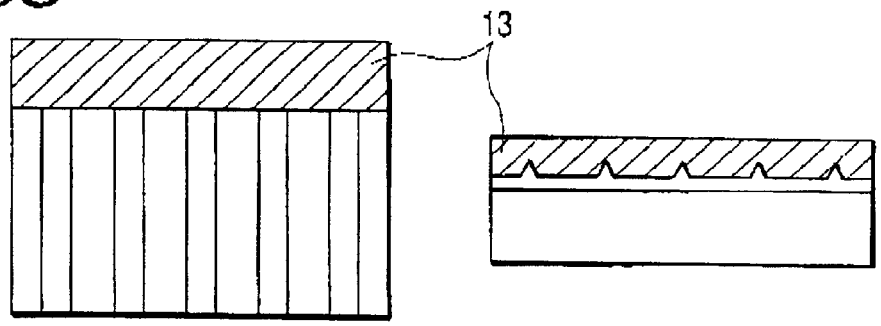
Figure 6D:
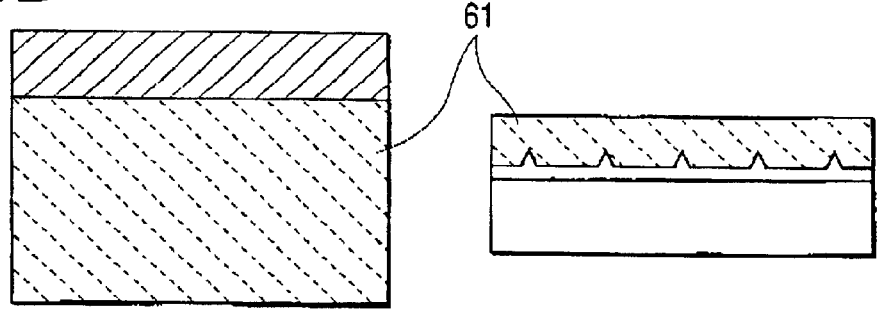
Figure 7E:
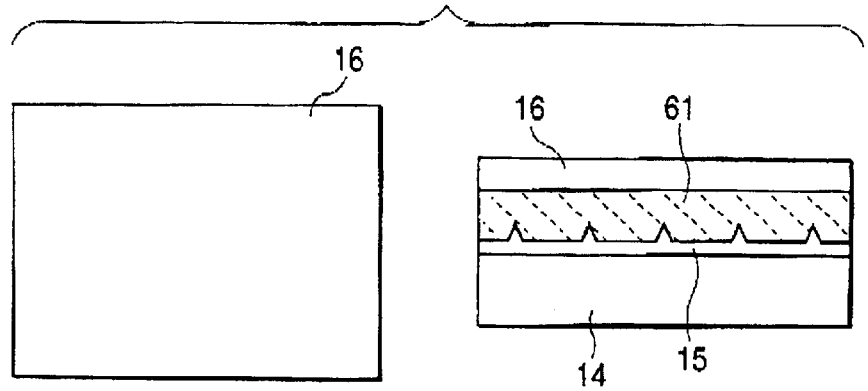
FIGS. 7E, 7F and 7G are schematic cross sectional views illustrating an example of the last half of manufacture processes for the structure according to the invention.
Figure 7F:
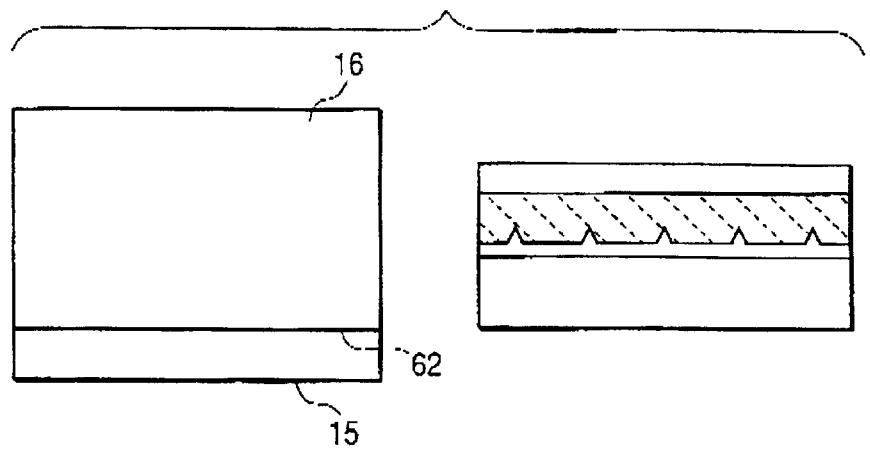
Figure 7G:
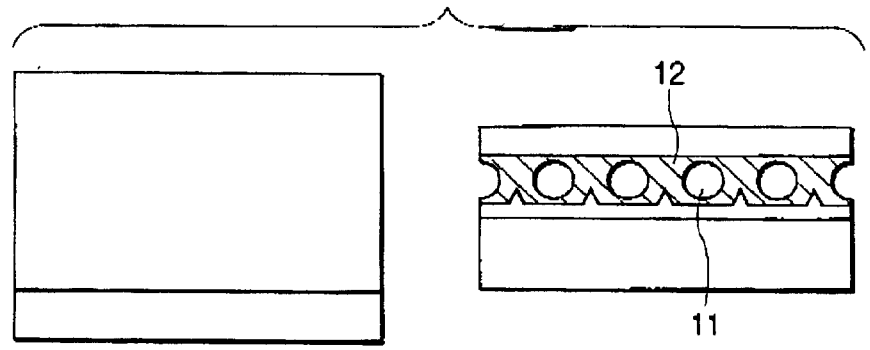

FIGS. 6A to 6D are schematic cross sectional views illustrating an example of the first half of manufacture processes for a nano structure according to the invention, FIGS. 7E to 7G are schematic cross sectional views illustrating an example of the last half of manufacture processes for the structure according to the invention, and FIG. 9 is a schematic diagram showing an anodic oxidation processing system.

Specifically, FIGS. 6A to 6D are plan views (left side) and cross sectional views (right side) illustrating the processes of forming a nano hole (pore) array, and FIG. 9 is a diagram showing the anodic oxidation processing system. In FIGS. 5A to 6D and FIGS. 7E to 7G, reference numeral 11 represents a pore (nano hole), reference numeral 12 represents an anodically oxidized oxide layer containing alumina as its main composition, reference numeral 13 represents an electrode layer, reference numeral 14 represents a substrate, reference numeral 15 represents a lower insulating layer, reference numeral 16 represents an upper insulating layer, reference numeral 61 represents a layer to be anodically oxidized, and reference numeral 62 represents an end surface from which anodic oxidation starts. In FIG. 9, reference numeral 81 represents a sample, reference numeral 82 represents a cathode of Pt, reference numeral 83 represents electrolytic solution, reference numeral 84 represents a reaction chamber, reference numeral 85 represents a power source for applying an anodic oxidation voltage, reference numeral 86 represents an ammeter for measuring an anodic oxidation current, reference numeral 87 represents a constant temperature oven, and reference numeral 88 represents a sample holder. Although not shown in FIG. 9, a computer and the like for automatically controlling and measuring voltage and current are assembled.

(a) Forming a Patterned Lower Insulating Layer

By using an Si substrate having a surface oxide layer of about 500 nm in thickness shown in FIG. 6A, a projection/recess pattern (projected pattern) was formed on the surface oxide layer as an underlying insulating layer.

First, before resist is coated on the surface oxide layer, the substrate surface was washed by ultrasonic waves by using acetone and IPA each for ten minutes, and thereafter dried in a clean oven for 20 minutes at 120° C. Then, antireflection film (100 nm thick) made of AZBARLi100 manufactured by Clariant Japan K.K. and a positive resist film (200 nm thick) of AZ5214E manufactured by Clariant Japan K.K. were coated by spin coating and dried (20 minutes at 90° C.).

Next, a projection/recess pattern of a line shape was formed on the resist through interference exposure. More specifically, the resist was exposed in a stripe shape by using He—Cd laser ($\lambda$=325 nm, interference fringes at a pitch of 230 nm) at a radiation amount of 50 mJ/cm². Thereafter, the resist was developed for about 60 seconds in developing solution diluted with pure water at a ratio of 1:1, so that recesses were formed only in the exposed regions and a regular projection/recess pattern extending to the surface of the insulating film was formed. The pitch between stripes was 230 nm.

Next, an etching process was executed to reflect the projection/recess pattern on the surface oxide layer. This etching process was executed by using $CF_4$ plasma under the conditions of 3 minutes, 200 W and 1.2 Pa. A projection/recess pattern of a line shape was therefore formed on the surface insulating film, as shown in FIG. 6B.

(b) Forming an Electrode Layer

Next, after an Nb film was formed to a thickness of 100 nm by sputtering, an electrode layer 13 was formed on the projection/recess pattern by a lift-off method, as shown in FIG. 6C.

(c) Forming a Layer to be Anodically Oxidized

Next, an Al film was formed to a thickness of 250 nm by sputtering, and an Al film region corresponding to a layer 61 to be anodically oxidized was formed by a lift-off method, the film 61 being juxtaposed with the electrode layer 13 as shown in FIG. 6D. The film forming conditions were DC sputtering at 300 W for 25 minutes.

(d) Forming an Upper Insulating Layer

Next, in order to form a surface insulating layer, an $SiO_2$ was formed to a thickness of 50 nm by sputtering to form an upper insulating layer 16 as shown in FIG. 7E. The film forming conditions were an RF sputtering method, 100 W and 5 minutes.

(e) Forming an End Surface

In order to expose an end surface from which anodic oxidation starts, the layer to be anodically oxidized and the upper insulating layer were dry-etched along a direction perpendicular to the projection/recess pattern, to form an end surface 62 as shown in FIG. 7F.

(f) Anodic Oxidation

By using the anodic oxidation processing system shown in FIG. 9, the end surface 62 was immersed in phosphoric acid solution of 0.3 M maintained at 5° C. and anodic oxidation was performed by applying 130 V to the electrode layer 13. After the anodic oxidation, the substrate was immersed in phosphoric acid solution of 5 wt % for 60 minutes to broaden the diameter of each nano hole.

<Evaluation>

The nano structure formed by the above-described method was observed with a field emission-scanning electron microscope (FE-SEM). It was confirmed that nano holes disposed regularly and having a hole pitch of about 230 nm and a circular hole diameter of about 150 nm as shown in FIG. 7G were formed.

EXAMPLE 2

With reference to FIGS. 8A to 8E, Example 2 will be described in which a nano structure of a lamination constitution is formed by the FIB method. FIGS. 8A to 8E are cross sectional views of the lamination constitution illustrating manufacture processes. In FIGS. 8A to 8E, reference numeral 61 represents a layer to be anodically oxidized, and reference numeral 71 represents a recess line.

(a) Forming a Layer to be Anodically Oxidized

Figure 8A:
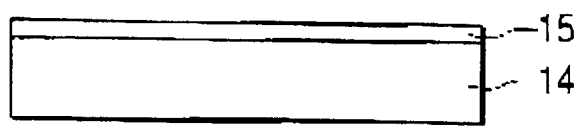
FIGS. 8A, 8B, 8C, 8D and 8E are schematic cross sectional views illustrating another example of manufacture processes for a structure according to the invention.

First, by using an Si substrate 14 having a surface oxide layer 15 of about 500 nm in thickness shown in FIG. 8A, a layer 61 to be anodically oxidized was formed. Namely, an Al film was formed to a thickness of 100 nm by DC sputtering under the conditions of 300 W and 10 minutes.

(b) Forming a Projection/Recess Pattern (Projected Pattern)

Figure 8B:
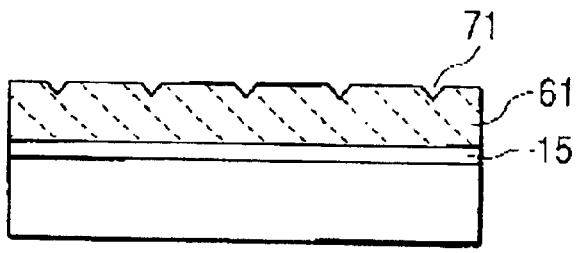

Next, on the surface of the layer to be anodically oxidized, lines at a pitch of 100 nm were drawn to form recess lines 71 as shown in FIG. 8B. Specifically, a focussed Ga ion beam having a diameter of 30 nm was radiated on the layer surface in lines at a pitch of 100 nm under the conditions of an ion current of 10 pA and an acceleration voltage of 30 KV to etch the Al layer to a depth of about 30 nm.

(c) Forming an Intermediate Insulating Layer

Figure 8C:
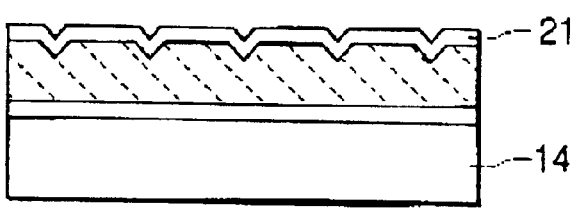
Figure 8D:
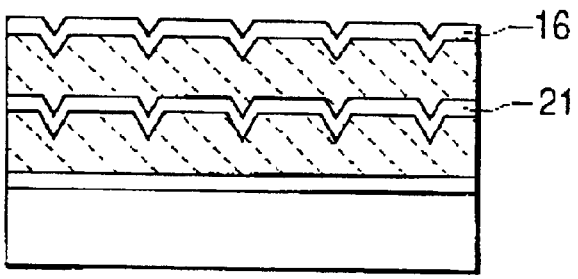
Figure 8E:
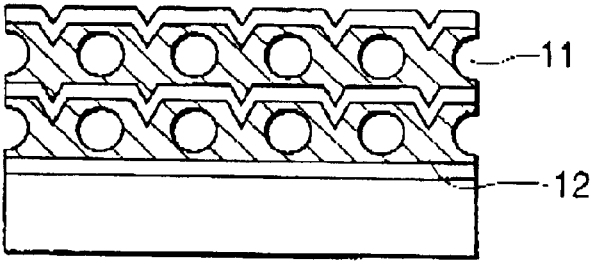

Next, in order to form an intermediate insulating layer, an $SiO_2$ film was formed to a thickness of 50 nm by RF sputtering under the conditions of 100 W and 5 minutes. The structure having the interlayer insulating film 21 upon which the projection/recess pattern was reflected was therefore formed as shown in FIG. 8C.

(d) Forming an Upper Later to be Anodically Oxidized and an Upper Insulating Layer Next, the processes (b) and (c) were repeated to form an Al film of 100 nm in thickness on the intermediate insulating layer 21 as the upper layer to be anodically oxidized and an upper insulating layer 16 of 50 nm in thickness. The projection/recess pattern was reflected upon the upper layers and the structure shown in FIG. 8D was formed.

(e) Forming Nano Holes Through Anodic Oxidation

A sample formed by the above-described processes was subjected to anodic oxidation by using the anodic oxidation processing system shown in FIG. 9. The anodic oxidation was arranged to progress from one end surface, and the other end surface was provided with an electrode. In Example 2, as acid electrolytic solution, oxalic acid solution of 0.3 M maintained at 17° C. by a constant temperature oven was used at an anodic oxidation voltage of 40 V. After the anodic oxidation, the sample was immersed in phosphoric acid solution of 5 wt % for 40 minutes to broaden the diameter of each nano hole.

<Evaluation>

The sample formed by the above-described method was observed with an FE-SEM. It was confirmed that a regular lamination nano hole structure shown in FIG. 8E was formed. The nano hole pitch was about 100 nm, the nano hole diameter was about 60 nm, and the nano holes in and between layers were disposed sufficiently regularly.

EXAMPLE 3

With reference to FIGS. 2A to 2D, Example 3 will be described in which projections and recesses of an insulating layer of a lamination constitution are formed by the FIB method and the insulating layer as the intermediate layer is formed through anodic oxidation. FIGS. 2A to 2D are cross sectional views showing the lamination constitution. In these Figures, reference numeral 21 represents an intermediate insulating layer.

(a) Forming Main Body and a Projection/Recess Pattern (Projected Pattern)

On an Si substrate having a surface oxide layer of about 500 nm thickness, projection/recess lines (projected pattern) at a pitch of 250 nm were formed by the FIB method. In this case, the focussed Ga ion beam diameter was 100 nm, an ion current was 50 pA, and an acceleration voltage was 30 KV. The focussed ion beam was radiated to the substrate in lines at a pitch of 250 nm. A height of the projection/recess pattern was about 100 nm.

(b) Forming a Layer to be Anodically Oxidized

Next, an Al film was formed to a thickness of 350 nm by DC sputtering under the conditions of 300 W and 35 minutes. Projections and recesses of the underlying insulating layer were reflected upon the Al film, and a height of the projection was about 50 nm.

(c) Forming an Intermediate Insulating Layer

Next, in order to form a surface insulating layer, the Al film was subjected to anodic oxidation in ammonium borate solution. A concentration of the ammonium borate was 3 wt % and the anodic oxidation was performed under the conditions of 80 V and 3 minutes at a room temperature. The surface of the Al film was uniformly oxidized about 100 nm, and the underlying Al layer of about 250 nm was not oxidized. With this surface oxidation, the projections and recesses on the surface of the Al film were removed and the surface was planarized. With this process, it was possible to form a flat intermediate insulating layer 21.

(d) Forming an Upper Layer to be Anodically Oxidized and an Upper Insulating Layer The line forming process and film forming process including the processes (a), (b) and (c) by using the FIB method are repeated to form an Al film having a thickness of 350 nm on the intermediate insulating layer as the upper layer to be anodically oxidized and to form an upper insulating layer 16 of about 100 nm thickness by subjecting the Al film surface to anodic oxidation by using ammonium borate solution. Formed with these processes were a sample having the projection/recess pattern of the intermediate insulating film same as that of the underlying insulating layer such as shown in FIG. 2A and a sample having the projection/recess pattern of the intermediate insulating film shifted by a half period from that of the underlying insulating layer such as shown in FIG. 2C.

(e) Forming Nano Holes Through Anodic Oxidation

The samples formed by the above processes were cut along a direction perpendicular to the projection/recess line, and thereafter subjected to anodic oxidation by using the anodic oxidation processing system shown in FIG. 9. The anodic oxidation was arranged to progress from one end surface, and the other end surface was provided with an electrode. In Example 3, as acid electrolytic solution, phosphoric acid solution of 0.3 M maintained at 8° C. by a constant temperature oven was used at an anodic oxidation voltage of 100 V.

<Result>

The cross sections of the formed samples were observed with an FE-SEM. It was confirmed that nano structures with regular nano holes shown in FIGS. 2A and 2C were formed.

The nano hole pitch was about 250 nm and the nano hole diameter was about 100 nm.

EXAMPLE 4

With reference to FIGS. 1A to 1C, FIGS. 3A and 3B, FIGS. 5A and 5B, FIGS. 6A to 6D and FIGS. 7E to 7G, a method of filling a filler in a nano hole formed by Example 1 will be described. In FIGS. 3A and 3B, reference numeral 31 represents a filler, and in FIGS. 5A and 5B, reference numeral 51 represents an electrode and reference numeral 52 represents a junction portion connecting a filler and an electrode.

(a) Forming Nano Holes

By using similar processes to those of Example 1, a nano structure having regular nano holes with a pitch of 100 nm, a diameter of 60 nm and a length of 1 $\mu$m was formed. An electrode layer of Cu was used and the bottom of each nano hole reached the Cu electrode layer.

(b) Forming Fillers

The sample formed by the process (a) was immersed in electrolytic solution made of 0.5 M cobalt sulfate and 0.005 M copper sulfate, together with an opposing platinum electrode and an Ag/AgCl reference electrode. Voltages of $-0.5$ V and $-1.2$ V were alternately applied to the electrode layer for 20 seconds and 0.1 seconds, respectively, relative to the reference electrode to grow a Co/Cu lamination film on the bottom of each nano hole and form a nano structure shown in FIGS. 3A and 3B. Plating was stopped when a filler 31 slightly projected from the nano hole.

While the voltage of $-0.5$ V was applied, only Cu ions were plated because Cu has lower electrodeposition potential, whereas while the voltage of $-1.2$ V was applied, dense Co ions were mainly plated so that a Cu/Co lamination Constitution was formed.

(c) Forming Electrodes and Junction Portions

Next, electrodes 51 shown in FIG. 5A were formed by photolithography and lift-off. The electrode was made of Pt and had a thickness of 100 nm. In order to improve a contact with the underlying silicon oxide, Ti was formed at an interface to a thickness of 5 nm. In order to connect one electrode to one filler 31 slightly projected, a junction portion was formed by the FIB method. In order to form the junction portion, a sample was placed in an FIB system and aligned in position and thereafter $W(CO)_6$ was gasificated and Ga ions were scanned in lines. $W(CO)_6$ gas was dissolved only in regions where the Ga ions were radiated, and W was attached.

<Evaluation>

A resistance between two electrodes of the sample formed by the above method was measured by applying a magnetic field. The resistance was reduced by about 10%. This can be ascribed to that the laminated filler exhibits the GMR effect.

It can be understood from the above description that fillers disposed in parallel to the substrate can be formed according to the invention.

<Effects>

As described so far, the following effects of the invention can be obtained.

(1) It is possible to control the layout, pitch, position, direction, shape and the like of nano holes to be formed through anodic oxidation. It is possible to provide a method of manufacturing a nano structure with nano holes disposed along a specific direction of the substrate.

(2) It is possible to form a regular nano structure having nano hole columns having a specific correlation.

(3) It is possible to fill a filler in each regular nano hole by plating, by utilizing the above-described technology.

(4) It is possible to provide a novel regular nano structure by utilizing the above-described technology.

With these effects, anodic oxidation alumina can be applied to various fields and can broaden the application field considerably. The nano structure of the invention can be used as functional material as it is, and in addition it can be used as base material, mold and the like of a new structure.

What is claimed is:

1. A method of manufacturing a structure with pores, comprising the steps of:

(A) disposing a lamination film on a substrate, the lamination film comprising insulating layers and a layer to be anodically oxidized and containing aluminum as a main composition; and (B) performing anodic oxidation starting from an end surface of the lamination film to form a plurality of pores having an axis substantially parallel to a surface of the substrate, wherein the layer to be anodically oxidized is sandwiched between the insulating layers, and a projected pattern substantially parallel to the axis of the pores is formed on at least one of the insulating layers at positions between the pores.

2. A method according to claim 1, wherein the layer to be anodically oxidized is made of aluminum.

3. A method according to claim 1, wherein at least one of the insulating layers is formed by anodic oxidation.

4. A method according to any one of claims 1 to 3, wherein a height of the projected pattern of the insulating layer is 1/10 or more of a thickness of the layer to be anodically oxidized.

5. A method according to any one of claims 1 to 3, further comprising a step of filling a filler in each of the pores after said step of performing anodic oxidation.

6. A method according to claim 5, wherein said step of filling a filler is performed by plating.

7. A method according to any one of claims 1 to 3, further comprising a step of forming an electrode layer connected to a bottom of each of the pores.

8. A structure with pores formed by the method comprising the steps of:

disposing a lamination film on a substrate, the lamination film comprising insulating layers and a layer to be anodically oxidized and containing aluminum as a main composition; and performing anodic oxidation starting from an end surface of the lamination film to form a plurality of pores having an axis substantially parallel to a surface of the substrate, wherein the layer to be anodically oxidized is sandwiched between the insulating layers, and a projected pattern substantially parallel to the axis of the pores is formed on at least one of the insulating layers at positions between the pores.

9. A structure according to claim 8, further comprising an electrode layer connected to a bottom of each of the pores.

10. A method of manufacturing a structure with pores comprising the steps of:

(A) sandwiching a film containing aluminum as a main composition between first and second insulating films; and (B) anodically oxidizing the film having aluminum as the main composition along a direction substantially perpendicular to a direction of making the first and second insulating films face each other, wherein projections are formed on a surface of at least one of the first and second insulating films in contact with the film containing aluminum as the main composition, the projections controlling a pitch between the pores to be formed by anodic oxidation.

11. A structure with pores comprising:

(A) a film sandwiched between first and second insulating films, said film containing aluminum oxide as a main composition;

(B) a plurality of pores disposed in said film containing aluminum as the main composition, a longitudinal direction of each of said pores being a direction substantially perpendicular to a direction of making said first and second insulating films face each other, and each of said pores being disposed substantially parallel; and (C) a projected pattern disposed among said pores, wherein said projected pattern is made of an insulating member in contact with said first or second insulating film and has a line shape substantially parallel to a longitudinal direction of each of said pores.

12. A structure according to claim 11, wherein said projected pattern is made of a partial region of said first or second insulating film.

13. A structure according to claim 8, wherein the layer to be anodically oxidized is made of aluminum.

14. A structure according to claim 8, wherein at least one of the insulating layers is formed by anodic oxidation.

15. A structure according to claim 13, further comprising an electrode layer connected to a bottom of each of the pores.

16. A structure according to claim 14, further comprising an electrode layer connected to a bottom of each of the pores.

* * * * *